(12) United States Patent
Petranovic et al.

(10) Patent No.: US 6,901,571 B1
(45) Date of Patent: May 31, 2005

(54) TIMING-DRIVEN PLACEMENT METHOD UTILIZING NOVEL INTERCONNECT DELAY MODEL

(75) Inventors: Dusan Petranovic, Cupertino, CA (US); Ranko Scepanovic, San Jose, CA (US); Ivan Pavisic, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/010,396

(22) Filed: Jan. 21, 1998

(51) Int. Cl.⁷ .............................................. G06F 17/50

(52) U.S. Cl. ........................................... 716/10; 716/4

(58) Field of Search .......... 395/500.11, 500.02–500.19; 716/10, 4

(56) References Cited

U.S. PATENT DOCUMENTS

| | | | | |
|---|---|---|---|---|
| 4,577,276 A | * | 3/1986 | Dunlop et al. | 364/491 |
| 5,218,551 A | * | 6/1993 | Agrawal et al. | 364/491 |
| 5,461,576 A | * | 10/1995 | Tsay et al. | 364/490 |
| 5,469,366 A | * | 11/1995 | Yang et al. | 364/489 |
| 5,475,607 A | * | 12/1995 | Apte et al. | 364/489 |
| 5,617,325 A | * | 4/1997 | Schaefer | 364/488 |
| 5,654,898 A | * | 8/1997 | Roetcisoender et al. | 364/490 |
| 5,659,484 A | * | 8/1997 | Bennett et al. | 364/491 |
| 5,666,290 A | * | 9/1997 | Li et al. | 364/491 |
| 5,831,863 A | * | 11/1998 | Scepanovic et al. | 364/488 |
| 5,841,672 A | * | 11/1998 | Spyrou et al. | 364/488 |
| 5,875,114 A | * | 2/1999 | Kagatani et al. | 364/489 |

OTHER PUBLICATIONS

K. Yamakoshi; M. Ino; Generalised Elmore Delay Expression for Distributed RC Tree Networks, Electronic Letters, pp. 617–618, Apr. 1993.*

W. Swartz; C. Sechen; Timing Driven Placement for Large Standard Cell Circuits, Proceedings of the 32nd ACM/IEEE Conference on Design Automation Conference, p. 211, Jan. 1995.*

D. Chengson et al., Signal Delay in Distributed RC Tree Networks, IEEE International Symosium on Circuits and Systems, pp. 2835–2837, vol. 3, Jun. 1988.*

L.P.P.P. van Ginneken, Buffer Placement in Distributed RC–tree Networks for Minimal Elmore Delay, IEEE International Symposium on Circuits and Systems, pp. 865–868, vol. 2, May 1990.*

J.P. Fishburn et al., Shaping a Distributed–RC line to Minimize Elmore Delay, IEEE Transactions on Circuits and Systems I: Fundamental Theory and Applications, pp. 1020–1022, Dec. 1995.*

(Continued)

*Primary Examiner*—A. M. Thompson
(74) *Attorney, Agent, or Firm*—Mitchell, Silberberg & Knupp

(57) ABSTRACT

A method for optimal placement of cells on a surface of an integrated circuit, comprising the steps of comparing a placement of cells to predetermined cost criteria and moving cells to alternate locations on the surface if necessary to satisfy the cost criteria. The cost criteria include a timing criterion based upon interconnect delay, where interconnect delay is modeled as a RC tree expressed as a function of pin-to-pin distance. The method accounts for driver to sink interconnect delay at the placement level, a novel aspect resulting from use of the RC tree model, which maximally utilizes available net information to produce an optimal timing estimate. Preferred versions utilize a RC tree interconnect delay model that is consistent with timing models used at design levels above placement, such as synthesis, and below placement, such as routing. Additionally, preferred versions can utilize either a constructive placement or iterative improvement placement method.

12 Claims, 1 Drawing Sheet

OTHER PUBLICATIONS

J. Rubinstein; P. Penfield; M.A. Horowitz, Signal Delay in RC Tree Networks, IEEE Transactions on Computer–Aided Design, pp. 202–211, Jul. 1983.*

W.C. Elmore, The Transient Response of Damped Linear Networks with Particular Regard to Wideband Amplifiers, Journal of Applied Physics, vol. 19, pp. 55–62, Jan. 1948.*

L. Pileggi, Coping With RC(L) Interconnect Design Headaches, IEEE/ACM International Conference on Computer–Aided Design, pp. 246–253, Nov. 1995.*

M. Borah et al., A Fast Algorithm For Minimizing the Elmore Delay to Identified Critical Sinks, IEEE Transactions on Computer–Aided Design of Integrated Circuits and Systems, pp. 753–759, Jul. 1997.*

J. Cong; C. Koh, Simultaneous Driver and Wire Sizing for Performance and Power Optimization, IEEE Transactions on VLSI Systems, vol. 2, No. 4, Dec. 1994.*

S. dos Santos; J. Swart, Modeling of Interconnection Lines For Simulation of VLSI Circuits, IEEE International Conference on Computer Design: VLSI in Computers and Processors, 1991. ICCCD'91, Oct. 1991.*

M.A.B. Jackson et al., Estimating and Optimizing RC Interconnect Delay During Physical Design, IEEE International Symposium on Circuits and Systems, pp. 869–871, vol. 2, May 1990.*

R. Gupta et al., The Elmore Delay As A Bound for RC Trees With Generalized Input Signals, IEEE Transactions on Computer–Aided Design of Integrated Circuits and Systems, vol. 16, pp. 95–104, Jan. 1997.*

J. Huang et al., An Efficient Timing–Driven Global Routing Algorithm, Proceedings of the 30th International Conference on Design Automation m pp. 596–600, Jan. 1993.*

* cited by examiner

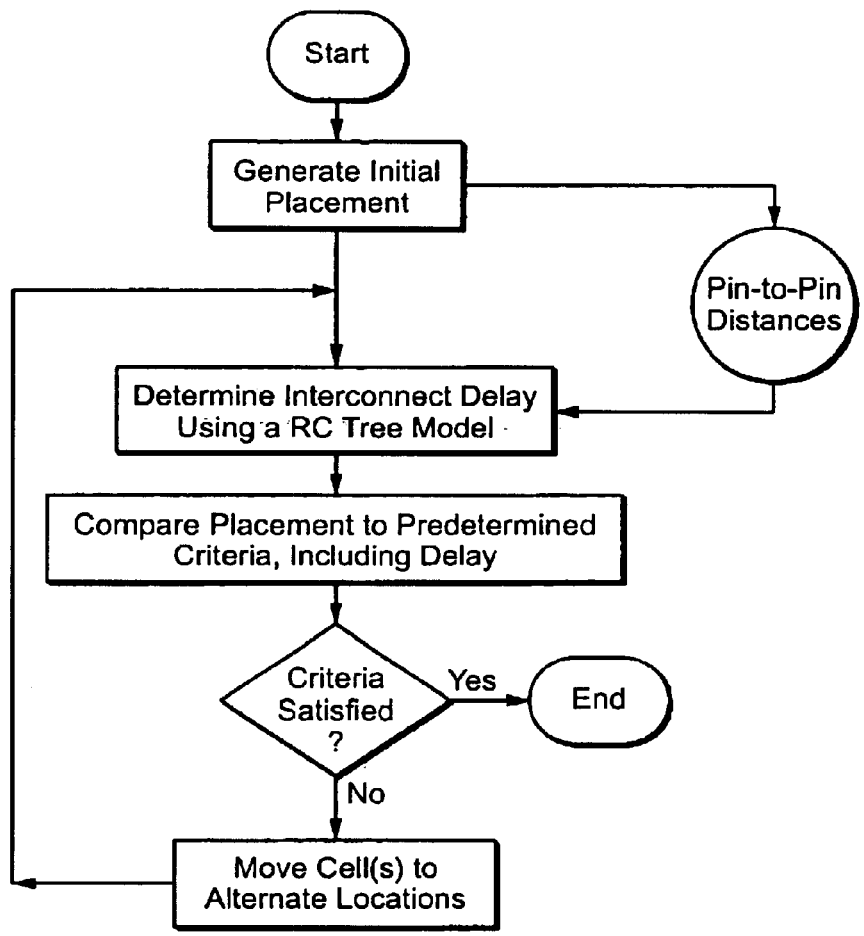
FIG._1
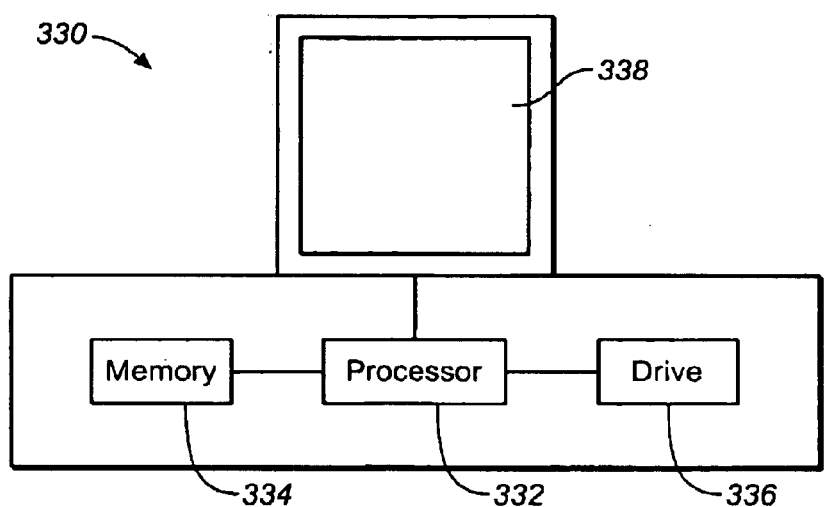
FIG._2

TIMING-DRIVEN PLACEMENT METHOD UTILIZING NOVEL INTERCONNECT DELAY MODEL

BACKGROUND OF THE INVENTION

1. Field of the Invention

This invention relates to the field of Computer Aided Design (CAD) of integrated circuits. More specifically, the present invention concerns a timing-driven placement method utilizing an accurate and efficient interconnect timing model.

2. Description of the Related Art

Microelectronic integrated circuits comprise a large number of electronic components (cells) and associated interconnections which are fabricated on a silicon base or wafer (chip). The silicon base is typically contained in a package that has a number of contacts which provide external output and input connections for the components. The design of an integrated circuit transforms a circuit description into a geometric description which is known as a layout. A layout consists of a set of planar geometric shapes in various layers of a silicon chip.

The process of converting electrical circuit specifications into a layout is called the physical design. Physical design involves placing predefined cells and elements in a fixed area, and routing wires between them. The process can be tedious, time consuming, and prone to many errors due to tight tolerance requirements and the minuteness of individual components. Current technology allows fabrication of several million transistors of less than one micron in size on one chip, and future developments are expected to allow fabrication of substantially more components of even smaller size.

Due to the large number of components and the exacting requirements of the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time, and enhanced chip performance.

The ultimate goal of physical design is to determine an optimal arrangement of devices in a plane surface of a chip and to find an efficient interconnection or routing scheme between the devices to achieve the desired functionality. The arrangement of individual cells is known as a cell placement. Depending upon the input, placement methods are classified into two major groups, constructive placement and interactive improvement methods. The input to constructive placement methods comprises a set of blocks (containing one or more cells) along with a netlist; constructive placement methods provide locations for the blocks.

Iterative improvement methods, on the other hand, start with an initial placement, which is then modified in search of a better placement. Such methods are applied in a recursive or iterative manner until no further improvement is possible, or the solution is considered to satisfy some predetermined criteria. Further details regarding particular placement methods are provided in R. Scepanovic, J. Koford and A. Andreev, U.S. patent application Ser. No. 08/672,725, filed Jun. 28, 1996, now U.S. Pat. No. 5,831,863 incorporated by reference herein.

In general, placement methods function by generating large numbers of possible placements and comparing them in accordance with some criteria, which is typically referred to as fitness. The fitness of a placement can be measured in a number of different ways, for example, overall chip size. A small size is associated with high fitness and vice-versa. Another measure of fitness is total wire length; a high total indicates low fitness and vice-versa. The relative desirability of a placement can alternatively be expressed in terms of cost, which can be considered as the inverse of fitness, with high cost correpsonding to low fitness and vice-versa.

Traditionally, the prime objective of placement methods is to minimize the total layout area by carefully placing the given modules and making all required interconnections. The objective function of most conventional placement methods is set to minimize the total area and/or total net length as a metric to achieve the minimization of the layout area. These placement methods try to shorten the net lengths among modules by placing the modules with more net connections closer together. By minimizing the total wire length, the conventional placement methods also attempt to solve timing constraints, which are the focus of the present invention.

This conventional approach produces satisfactory performance as long as the delay attributable to interconnections is small compared with the delay of the cells. In the past, the difference between the estimated wire delay (in synthesis and placement) and the routed wire delay was relatively small because the total intrinsic cell delay was much larger than the total wire delay on each path. However, with advances in integrated circuit fabrication technology, the situation is changing dramatically. Namely, designers of deep submicron integrated circuits are discovering that, with device scaling, the influence of the interconnect delay is playing more significant role and that it cannot be neglected in the design process. Placement methods that minimize the total wire length may in some cases increase the interconnect delay at critical nets. One of the reasons is that the delays caused by the same length of the wire vary significantly for nets with different driving strengths and load characteristics. It is, therefore, necessary to use direct minimization of the interconnect delays if timing constraints are important.

In response to this problem, various prior art timing-driven placement methods have been developed to control the wire lengths on a set of critical paths. An additional term in the cost function is used to correct the placement in such a way to satisfy the time bounds for all signal paths through the circuit. These methods use a model which accounts for the interconnect by estimating parasitic capacitance (capacitance of the interconnect) using a half-perimeter bounding-box metric, and adding the parasitic capacitance to the total net input cell capacitance in order to obtain total driving cell load. An example is the method of W. Swartz and C. Sechen, "Timing Driven Placement for Large Standard Cell Circuits," Proc. Design Automation Conference, June 1995, pp. 211–215, incorporated by reference herein. Path delay is then computed as a sum of all net delays for the path, and the delay of the net is determined as a sum of intrinsic delay of the gate plus the equivalent driver resistance multiplied with the total load seen by the driver. This model ignores interconnect resistance, which is not acceptable for deep submicron designs, especially those having half a million or more gates implemented using a 0.25 micron or 0.18 micron fabrication process.

In order to properly select an additional cost function term and optimize placement, conventional interconnect modeling schemes require significant improvement. It is no longer sufficient to model the interconnect delay as a linear function of the node capacitances (lumped capacitance model). The interconnect resistance should be taken into account and, to do that properly, the interconnect must be modeled as a network of distributed resistors and capacitors—an "RC tree."

Prior art RC models are problematic. The danger of overly simplified prior art models based on wire length estimates for nets is that they may result in nonconvergence of the design process due to inconsistency of timing information at different levels of design. On the other hand, the most accurate prior art timing models, such as the Asymptotic Waveform Evaluation method (AWE), require post routing information and are computationally too expensive to be used (with routing estimates) in placement methods.

To summarize, the problem of obtaining consistent, accurate and efficient timing information for the timing-driven placement has not been satisfactorily solved by prior art methods, and involves two subproblems:

(a) unavailability of interconnect topology and exact wire lengths (b) inappropriate interconnect models used in placement.

What is needed is a method that utilizes all the information available at the placement level, and narrows the gap between net-oriented layout information and inherently path-oriented timing information. Bridging this gap is one of the most challenging obstacles to producing good timing-driven placement tools. Therefore, an object of the present invention is to provide a method that maximally utilizes all net information available during placement in order to obtain a timing estimate which is as realistic as is feasible at the placement level. Another object of the present invention is to provide a method with an interconnect delay model that is consistent with the timing models used at the design levels above placement (synthesis) and below placement (routing).

SUMMARY OF THE INVENTION

These objects are achieved by the method of the present invention, which comprises the steps of comparing a placement of cells to predetermined cost criteria and moving cells to alternate locations if necessary to satisfy the predetermined cost criteria; the cost criteria include a timing criterion based upon cell and interconnect delay, where interconnect delay is modeled as a RC tree expressed as a function of pin-to-pin distance. The present invention accounts for driver to sink interconnect delay at the placement level, a novel aspect resulting from use of the RC tree model, which maximally utilizes available net information to produce an optimal timing estimate for placement. Preferred versions of the present invention utilize a RC tree interconnect delay model that is consistent with timing models used at design levels above placement, such as synthesis, and below placement, such as routing. Additionally, preferred versions of the present invention can utilize either a constructive placement or iterative improvement placement method.

These and other aspects, features, and advantages of the present invention will be apparent to those persons having ordinary skill in the art to which the present invention relates from the foregoing description and the accompanying drawings.

BRIEF DESCRIPTION OF THE DRAWINGS

FIG. 1 is a flowchart of a preferred version of the method of the present invention.

FIG. 2 is a diagram of an apparatus embodying a preferred version of the present invention.

DESCRIPTION OF THE PREFERRED EMBODIMENTS

As is shown by FIG. 1, a flowchart of a preferred version of the present invention, the method of the present invention generally comprises the steps of comparing a placement of cells to predetermined cost criteria and moving cells to alternate locations on the surface if necessary to satisfy the cost criteria. The cost criteria include a timing criterion based upon cell and interconnect delay, where interconnect delay is modeled as a RC tree. Preferred versions of the present invention utilize RC tree interconnect delay models that are consistent with timing models used at design levels above placement, such as synthesis, and below placement, such as routing. The interconnect delay models of the present invention are now described in greater detail.

Given a routing tree with a driver and a set of sinks, a grid is superimposed at the routing plane to segment the wire and the delay from the input of the driver to the input of any sink is computed as $$\Delta = \Delta_C + \Delta_{INT} \quad (1)$$

where $\Delta_C$ is the driver cell delay and $\Delta_{INT}$ is the interconnect delay determined by:

$$\Delta_{INT} = \sum_{\text{all nodes } n} R_n C_n \quad (2)$$

where $R_n$ is the resistance between the driver and the node n and $C_n$ is capacitance at node n where the summation is performed over all nodes in the net.

A simplification of the above equation (2) in order to utilize only the information available at the placement level is as follows:

$$\Delta_{INT} = \sum_{i=1}^{k} r_0 l_i C_{Si} + \frac{r_0 c_0}{2} l_{wl}^2 \quad (3)$$

where $r_0$ is unit length resistance, $c_0$ is unit length capacitance, $l_i$ is length of the path from a driver to a sink i, $l_{wl}$ is the total net wire length, and $C_{Si}$ is input capacitance of sink i, where i=1,2, ... k.

Since net wire length is not available at the placement level, one of the following two approximations is used for the net interconnect delay:

$$\Delta_{INT} = \sum_{i=1}^{k} r_0 l_i C_{Si} + \frac{r_0 c_0}{2} \sum_{i=1}^{k} l_i^2 \text{ or} \quad (4)$$

$$\Delta_{INT} = \sum_{i=1}^{k} r_0 l_i C_{Si} + \frac{r_0 c_0}{2} l_{wlest}^2 \quad (5)$$

where $l_{wlest}$ is a half perimeter bounding box (or some other, more precise) estimate of the net wire length.

The simplicity of the delay model (3) is not without a price. It provides only an upper bound of the worst case RC net interconnect delay. Model (4) uses only pin-to-pin distances to calculate the delay and still preserves an upper bound, while model (5) also uses the net wire length estimate and may, with half perimeter bounding box estimates, produce results which are either higher or lower than the real driver-sink interconnect delays. The biggest problem, however, is that neither of the above models distinguishes the delays at different sinks. This may result in unnecessary over-constraining of some noncritical paths within a net, which in turn may worsen some of the critical driver-sink paths of the neighboring nets.

To overcome these problems, another version of the interconnect delay model of the present invention distinguishes the delays at different sinks. This version recognizes that the delay from the input of a driver to the input of a sink i consists of the driver cell delay, $\Delta_C$ and interconnect delay, $\Delta_{INTi}$, between a driver and a sink i, i.e.:

$$\Delta_i = \Delta_C + \Delta_{INTi} \tag{6}$$

The driver cell delay, $\Delta_C$, is read from a standard technology library. Assuming again that the interconnect has an electrical model in the form of RC-tree, the path delay from each driver to the sink can be calculated by segmenting wire and then summing up the individual contribution of wire segments along the path from driver to the sink. See W. C. Elmore, "The Transient Response of Damped Linear Networks with Particular Regard to Wideband Amplifiers," J. Appl. Phys. Vol. 19, No. 1, January 1948, pp. 55–63, incorporated by reference herein, and J. Rubinstein, P. Penfield, and M. A. Horowitz, "Signal Delay in RC Tree Networks," IEEE Trans. on CAD, 1983, pp. 202–211, incorporated by reference herein. The delay of wire segment is then equal to the product of segment resistance and the down stream capacitance. This approach is used in timing-driven routing algorithms and requires routing information for precise calculation of path delay, and thus cannot be used without modification for placement.

In order to derive a consistent timing model at the placement level, a routing level timing model was used as a starting point and then simplified to use only information available at placement level. As the first step in the simplification process, the interconnect delay model was derived in a form that consists of two terms:

$$\Delta_{INTi} = \Delta_{LINKi} + \Delta_{TPLGi} \tag{7}$$

The first term, $\Delta_{LINKi}$, accounts for the contribution of the direct driver-sink link to the path delay, while the second term, $\Delta_{TPLGi}$, is contribution of the rest of the net topology to the path delay:

$$\Delta_{LINKi} = \frac{r_0 c_0}{2} l_i (l_i + 1) + r_0 l_i C_{Si}, \tag{8}$$

$$\Delta_{TPLGi} \leq \sum_{j=1, j \neq i}^{i} r_0 l_{oji} [c_0 (l_j - l_{oji}) + C_{Sj}] \tag{9}$$

In the above equations, as in (2), $r_0$ is unit length resistance, $c_0$ is unit length capacitance, $l_i$ is length of the path from a driver to a sink i, $l_{oji}$ is length of the overlapping ire that connects driver and sinks j and i, $C_{Si}$ is input capacitance of sink t and $C_{sj}$ is the input capacitance of sink j, where i=1,2, ... k.

The topology term is expressed as a function of length of overlapping wire and it is not possible to exactly calculate it without routing information. Therefore, the method of the present invention provides an upper bound for that term. The maximum of the topology delay term is found for:

$$l_{oji} = \frac{l_j}{2} + \frac{C_j}{2c_0}, \; j, i = 1, 2, \ldots, k \tag{10}$$

and the upper bound for the topology delay is:

$$\Delta_{INTCi} \leq \sum_{j=1, j \neq i}^{k} \alpha_j \frac{r_0 c_0}{2} l_j^2, \; \alpha_j = \frac{1}{2} 1 + \frac{C_{Sj}^2}{C_j}, \; \text{for } C_{Sj} < C_j \tag{11}$$

$$\alpha_j = \frac{2C_{Sj}}{C_j}, \; \text{for } C_{Sj} \geq C_j \tag{12}$$

where $$C_j = l_j c_0 \tag{13}$$

It can be noted that the upper bound depends on the ratio between input capacitance of the sink and the capacitance of the driver-sink wire. When the wire capacitance, $C_j$, is much higher than sink input capacitance, $C_{Sj}$, coefficient $\alpha \sim (\frac{1}{2})$. For $C_j = C_{Sj}$, $\alpha = 2$, and for dominant input capacitance, i.e., $C_{Sj} \ll C_j$, since maximum of the topology term is obtained for $$l_{oji} = \frac{1}{2} l_j + \frac{C_{Sj}}{c_0} > l_j,$$

the coefficient $\alpha$ is determined by the maximum possible overlap $l_{oji} = l_j$ and is equal to $$\alpha = \frac{2C_{Sj}}{C_j}.$$

Now, the upper bound of interconnect delay can be written in the form:

$$\Delta_{INTi} \leq \frac{r_0 c_0}{2} l_i (l_i + 1) + r_0 l_i C_{Si} + \sum_{j=1, j \neq i}^{k} \alpha_j \frac{r_0 c_0}{2} l_j^2 \tag{14}$$

It should be also observed that the upper bound is expressed as a function of pin-to-pin distance, which is more precise information at the placement level than the wire length estimate. Moreover, the model represented by the above equation (14) gives an upper bound for all individual driver-sink interconnect delays. In summary, the present invention accounts for driver to sink interconnect delay at the placement level, a novel aspect resulting from use of RC tree models, which maximally utilize available net information to produce optimal timing estimates.

An interconnect timing model should also take into account the fact that placement is an intermediate step between synthesis and routing and that the highest degree of consistency of models at these levels should be provided. The models of the present invention maximally utilize only the information available at the placement level, but also allow for the possibility of using global router interconnect topology information if available. On the other hand, the models can easily be simplified one step further to make them appropriate for the use at synthesis level. To achieve this consistency and flexibility, the models were derived in bottom up fashion, starting from the routing level and assuming the availability of routing information. Then the models were simplified for higher levels of hierarchy so that they use only the information available at the particular level.

Referring now to FIG. 2, an apparatus 330 for implementing the present invention is illustrated. The apparatus 330 comprises a processor 332 and memory 334 connected to the processor for storing instructions for the processor 332. The memory 334 stores the instructions for the processor 332 to perform the above-discussed tasks. A hard drive 336, connected to the processor 332, contains initial placement information as well as the final placement which is produced as the result of the above-described operations. The final placement may be displayed by a monitor 338 which is also connected to the processor 332. After final placement is achieved, the cells are then physically placed onto the surface of an integrated circuit device in accordance with said final placement. See, R. Scepanovic, J. Koford and A. Andreev, U.S. patent application Ser. No. 08/672,725, now U.S. Pat. No. 5,831,863, at 1:12 to 2:21, 8:1–13, and 20:15 to 21:20.

The specific preferred versions of the method described herein, as well as the basic steps which they represent (even if they are replaced by different versions), are designed for implementation in a general purpose computer. Furthermore, each of the preferred versions described herein, as well as the basic steps represented by such versions, can be encoded on computer storage media such as CD ROMS, floppy disks, computer hard drives, and other magnetic, optical, other machine readable media, whether alone or in combination with one or more of the preferred versions and steps described herein.

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the cope thereof as limited solely by the claims appended hereto.

In the following claims, those elements which do not include the words "means for" are intended not to be interpreted under 35 U.S.C. § 112 ¶ 6.

What is claimed is:

1. A method for placement of a plurality of cells on a surface of an integrated circuit, said method comprising the steps of:
   comparing a placement of the cells to predetermined cost criteria; and
   moving cells to alternate locations on the surface if necessary to satisfy the predetermined cost criteria,
   wherein the predetermined cost criteria include a timing criterion based upon an interconnect delay, which is defined as a delay associated with an interconnect,
   wherein to determine the delay, the interconnect is modeled as a network of distributed resistors and capacitors, and
   wherein the interconnect delay is calculated according to the equation $$\Delta_{INT} = \sum_{i=1}^{k} r_0 l_i C_{Si} + \frac{r_0 c_0}{2} \sum_{i=1}^{k} l_i^2$$

2. A method for placement of a plurality of cells on a surface of an integrated circuit, said method comprising the steps of:
   comparing a placement of the cells to predetermined cost criteria; and
   moving cells to alternate locations on the surface if necessary to satisfy the predetermined cost criteria,
   wherein the predetermined cost criteria include a timing criterion based upon an interconnect delay, which is defined as a delay associated with an interconnect,
   wherein to determine the delay, the interconnect is modeled as a network of distributed resistors and capacitors, and
   wherein an upper bound for the interconnect delay is calculated according to the equation $$\Delta_{INTi} \leq \frac{r_0 c_0}{2} l_i (l_i + 1) + r_0 l_i C_{Si} + \sum_{j=1, j \neq i}^{k} \alpha_j \frac{r_0 c_0}{2} l_j^2$$

3. An integrated circuit comprising:
   a silicon base having a plurality of cells and associated interconnections fabricated thereon; and
   a package containing the silicon base, wherein the package has a plurality of contacts which provide external output and input for the cells,
   wherein the cells have been placed within the integrated circuit to satisfy predetermined cost criteria,
   wherein the predetermined cost criteria include a timing criterion based upon interconnect delay, which is defined as a delay associated with an interconnect,
   wherein to determine the delay, the interconnect was modeled as a network of distributed resistors and capacitors, and
   wherein the interconnect delay is calculated according to the equation $$\Delta_{INT} = \sum_{i=1}^{k} r_0 l_i C_{Si} + \frac{r_0 c_0}{2} \sum_{i=1}^{k} l_i^2$$

4. An integrated circuit comprising:
   a silicon base having a plurality of cells and associated interconnections fabricated thereon; and
   a package containing the silicon base, wherein the package has a plurality of contacts which provide external output and input for the cells,
   wherein the cells have been placed within the integrated circuit to satisfy predetermined cost criteria,
   wherein the predetermined cost criteria include a timing criterion based upon interconnect delay, which is defined as a delay associated with an interconnect,
   wherein to determine the delay, the interconnect was modeled as a network of distributed resistors and capacitors, and
   wherein an upper bound for the interconnect delay is calculated according to the equation $$\Delta_{INTi} \leq \frac{r_0 c_0}{2} l_i (l_i + 1) + r_0 l_i C_{Si} + \sum_{j=1, j \neq i}^{k} \alpha_j \frac{r_0 c_0}{2} l_j^2$$

5. An apparatus for determining a placement of a plurality of cells within an integrated circuit (IC) chip, said apparatus comprising:
   a processor; and
   memory connected to said processor,
   said memory having instructions for comparing a placement of the cells to predetermined cost criteria, and moving cells to alternate locations on the surface if necessary to satisfy the predetermined cost criteria, wherein the predetermined cost criteria include a timing criterion based upon interconnect delay which is defined as a delay associated with an interconnect, wherein to determine the delay, the interconnect is modeled as a network of distributed resistors and capacitors, and wherein the interconnect delay is calculated according to the equation $$\Delta_{INT} = \sum_{i=1}^{k} r_0 l_i C_{Si} + \frac{r_0 c_0}{2} \sum_{i=1}^{k} l_i^2$$

6. An apparatus for determining a placement of a plurality of cells within an integrated circuit (IC) chip, said apparatus comprising:

a processor; and memory connected to said processor, said memory having instructions for comparing a placement of the cells to predetermined cost criteria, and moving cells to alternate locations on the surface if necessary to satisfy the predetermined cost criteria, wherein the predetermined cost criteria include a timing criterion based upon interconnect delay, which is defined as a delay associated with an interconnect, wherein to determine the delay, the interconnect is modeled as a network of distributed resistors and capacitors, and wherein an upper bound for the interconnect delay is calculated according to the equation $$\Delta_{INTi} \leq \frac{r_0 c_0}{2} l_i (l_i + 1) + r_0 l_i C_{Si} + \sum_{j=1, j\neq i}^{k} \alpha_j \frac{r_0 c_0}{2} l_j^2$$

7. A computer storage medium containing instructions for a processor to determine a placement of a plurality of cells on a surface of an integrated circuit, said instructions comprising the steps of:

comparing a placement of the cells to predetermined cost criteria; and moving cells to alternate locations on the surface if necessary to satisfy the predetermined cost criteria, wherein the predetermined cost criteria include a timing criterion based upon interconnect delay, which is defined as a delay associated with an interconnect, wherein to determine the delay, the interconnect is modeled as a network of distributed resistors and capacitors, and wherein the interconnect delay is calculated according to the equation $$\Delta_{INT} = \sum_{i=1}^{k} r_0 l_i C_{Si} + \frac{r_0 c_0}{2} \sum_{i=1}^{k} l_i^2$$

8. A computer storage medium containing instructions for a processor to determine a placement of a plurality of cells on a surface of an integrated circuit, said instructions comprising the steps of:

comparing a placement of the cells to predetermined cost criteria; and moving cells to alternate locations on the surface if necessary to satisfy the predetermined cost criteria, wherein the predetermined cost criteria include a timing criterion based upon interconnect delay, which is defined as a delay associated with an interconnect, wherein to determine the delay the interconnect is modeled as a network of distributed resistors and capacitors, and wherein an upper bound for the interconnect delay is calculated according to the equation $$\Delta_{INTi} \leq \frac{r_0 c_0}{2} l_i (l_i + 1) + r_0 l_i C_{Si} + \sum_{j=1, j\neq i}^{k} \alpha_j \frac{r_0 c_0}{2} l_j^2$$

9. A method for placement of a plurality of cells on a surface of an integrated circuit, said method comprising the steps of:

calculating an interconnect delay, defined as a delay for an interconnect between a driver and a sink in a placement of cells;

comparing the placement of the cells to predetermined cost criteria which include a timing criterion based upon the interconnect delay; and moving cells in the placement of cells to alternate locations on the surface if necessary to satisfy the predetermined cost criteria, wherein the interconnect is part of a net, and wherein calculation of the interconnect delay comprises determining a first delay that accounts for a contribution of a direct path between the driver and the sink and determining a second delay that accounts for a contribution of a portion of the net that does not include the direct path to the interconnect delay, and wherein modeling the interconnect comprises utilizing a term that corresponds to a length of an overlapping wire.

10. An integrated circuit comprising:

a silicon base having a plurality of cells and associated interconnections fabricated thereon; and a package containing the silicon base, wherein the package has a plurality of contacts which provide external output and input for the cells, wherein the cells have been placed within the integrated circuit to satisfy predetermined cost criteria, wherein the predetermined cost criteria include a timing criterion based upon interconnect delay, which is defined as a delay associated with an interconnect, wherein the interconnect is part of a net, and wherein calculation of the interconnect delay comprises determining a first delay that accounts for a contribution of a direct path between the driver and the sink and determining a second delay that accounts for a contribution of a portion of the net that does not include the direct path to the interconnect delay, and wherein modeling the interconnect comprised utilizing a term that corresponds to a length of an overlapping wire.

11. An apparatus for determining a placement of a plurality of cells within an integrated circuit (IC) chip, said apparatus comprising:

a processor; and memory connected to said processor, said memory having instructions for calculating an interconnect delay, defined as a delay for an interconnect between a driver and a sink in a placement of cells, comparing the placement of cells to predetermined cost criteria which include a timing criterion based upon the interconnect delay, and moving cells in the placement of cells to alternate locations on the surface if necessary to satisfy the predetermined cost criteria, wherein the interconnect is part of a net, and wherein calculation of the interconnect delay comprises determining a first delay that accounts for a contribution of a direct path between the driver and the sink and determining a second delay that accounts for a contribution of a portion of the net that does not include the direct path to the interconnect delay, and wherein modeling the interconnect comprises utilizing a term that corresponds to a length of an overlapping wire.

12. A computer storage medium containing instructions for a processor to determine a placement of a plurality of cells on a surface of an integrated circuit, said instructions comprising the steps of:

calculating an interconnect delay, defined as a delay for an interconnect between a driver and a sink in a placement of cells;

comparing the placement of the cells to predetermined cost criteria which include a timing criterion based upon the interconnect delay; and moving cells in the placement of cells to alternate locations on the surface if necessary to satisfy the predetermined cost criteria, wherein the interconnect is part of a net, and wherein calculation of the interconnect delay comprises determining a first delay that accounts for a contribution of a direct path between the driver and the sink and determining a second delay that accounts for a contribution of a portion of the net that does not include the direct path to the interconnect delay, and wherein modeling the interconnect comprises utilizing a term that corresponds to a length of an overlapping wire.

* * * * *